United States Patent [19]

Cronin et al.

[11] Patent Number: 5,372,612
[45] Date of Patent: Dec. 13, 1994

[54] SEMICONDUCTOR MATERIAL CONTACTING MEMBER

[75] Inventors: Wayne A. Cronin, Tempe; Francis W. Barton, Jr., Mesa; Kirby F. Koetz, Chandler, all of Ariz.

[73] Assignee: Motorola, Inc., Schaumburg, Ill.

[21] Appl. No.: 82,641

[22] Filed: Jun. 28, 1993

[51] Int. Cl.$^5$ .................................... B28D 5/02
[52] U.S. Cl. .......................... 29/25.01; 414/222; 414/225; 414/935; 414/941
[58] Field of Search ............... 29/25.01, 25.02, 25.03; 204/298.15, 298.25, 298.28, 298.35; 414/222, 223, 225, 935, 941

[56] References Cited

U.S. PATENT DOCUMENTS

| | | | |
|---|---|---|---|
| 4,915,564 | 4/1990 | Eror et al. | 414/225 |
| 5,046,909 | 9/1991 | Murdoch | 414/225 |
| 5,061,144 | 10/1991 | Akimoto et al. | 414/225 |
| 5,100,285 | 3/1991 | Wagner | 414/225 |
| 5,154,730 | 10/1992 | Hodos et al. | 29/25.01 |
| 5,281,320 | 1/1994 | Turner et al. | 414/225 |
| 5,288,379 | 2/1994 | Namiki et al. | 414/935 |

FOREIGN PATENT DOCUMENTS 1732398  5/1992  U.S.S.R. .................. 414/941

*Primary Examiner*—Brian E. Hearn
*Assistant Examiner*—Kevin M. Picardat
*Attorney, Agent, or Firm*—Aaron Bernstein

[57] ABSTRACT

A semiconductor material contacting member which greatly reduces potential for semiconductor material breakage is provided. Preferably, the contacting member is a ceramic cylinder (60) which can be used to brace a semiconductor wafer (14) in a wafer station (2) of a sputtering system. The ceramic cylinder has an annular shoulder at one end (68), with a flat outer surface. The flat outer surface contacts the wafer (14) along a line (74). The line contacting surface (74) distributes pressure and heat across the contacting surface. Additionally, the ceramic cylinder (60) is relatively soft, thus avoiding damaging the semiconductor material.

5 Claims, 3 Drawing Sheets

SEMICONDUCTOR MATERIAL CONTACTING MEMBER

BACKGROUND OF THE INVENTION

The present invention relates, in general, to devices used for handling semiconductor material, and more particularly, to members for contacting semiconductor material.

Great care must be taken when handling semiconductor material during production, processing and the like. For example, semiconductor material in the form of wafers are typically handled in large quantities as they are processed to form semiconductor devices. During the handling of the wafers, the wafers are subject to breaking due to mishandling by the manufacturing and processing equipment.

Broken wafers is the source of a substantial undesired expense encountered in the course of processing. The wafers themselves are expensive. Additionally, if the wafers are broken during device fabrication, a great deal of value has been added to the wafer. When the wafer breaks due to mishandling by the processing equipment, the present value of the wafers is lost.

Furthermore, broken wafers cause a substantial interruption in the manufacture process. Wafers can break during any stage in the device fabrication process. Often, wafers break inside sophisticated process equipment which may be evacuated and require a clean environment, devoid of any particles. When a wafer breaks the broken wafer must be cleaned out, and any particle contaminants resulting from the break must be removed. The cleaning process results in significant downtime of processing equipment. When the processing equipment which must be shut down is part of an assembly line manufacturing process, the entire manufacturing line stops. The obvious result is a significant negative impact on production capacity.

Modern processes and materials are making even greater demands on material handling assemblies with regard to avoiding breakage. For example, relatively thinner silicon wafers are now being used. Furthermore, gallium arsenide wafers are being used for an increasing number of applications. Gallium arsenide is much more brittle than the conventional standard silicon wafer. Additionally, gallium arsenide distributes heat much more inefficiently than silicon, yet has about 2.5 times the thermal expansion coefficient. Consequently, gallium arsenide is subject to breakage due to the application of heat in a small localized area. Furthermore, gallium arsenide wafers are typically polished on the backside as well as the front. Wafer handling equipment which relied on friction from the backside to avoid sliding and scoring is ineffective. Additionally, processes are employing much higher temperatures and subjecting wafers to various other more aggravating conditions.

The change in processing and materials presents problems with regard to handling wafers and creates an even greater need for semiconductor material handling equipment which avoids breakage. Accordingly, wafer handling equipment, and particularly a semiconductor material contacting member, is needed which overcomes the severe disadvantages presented.

SUMMARY OF THE INVENTION

Briefly stated, the scope of the present invention encompasses a semiconductor material contacting member comprising a ceramic member. The ceramic member preferably comprises a substantially ceramic material. The ceramic member also comprises a substantially flat portion which has a contacting surface. The flat portion is adapted to contact semiconductor material. Additionally, the flat portion is capable of distributing pressure to the semiconductor material throughout the contacting surface.

Moreover, the scope of the present invention encompasses a method of contacting semiconductor material. The method includes the step of providing a ceramic cylinder which includes an annular flat portion. The flat portion has a contact surface. The method additionally includes the step of contacting the semiconductor material with the contact surface, thereby distributing pressure to the semiconductor material throughout the contact surface.

The preferred semiconductor material contacting member and method detailed below has, in one application, reduced wafer breakage by a factor of ten.

DETAILED DESCRIPTION OF THE DRAWINGS

Figure 1:
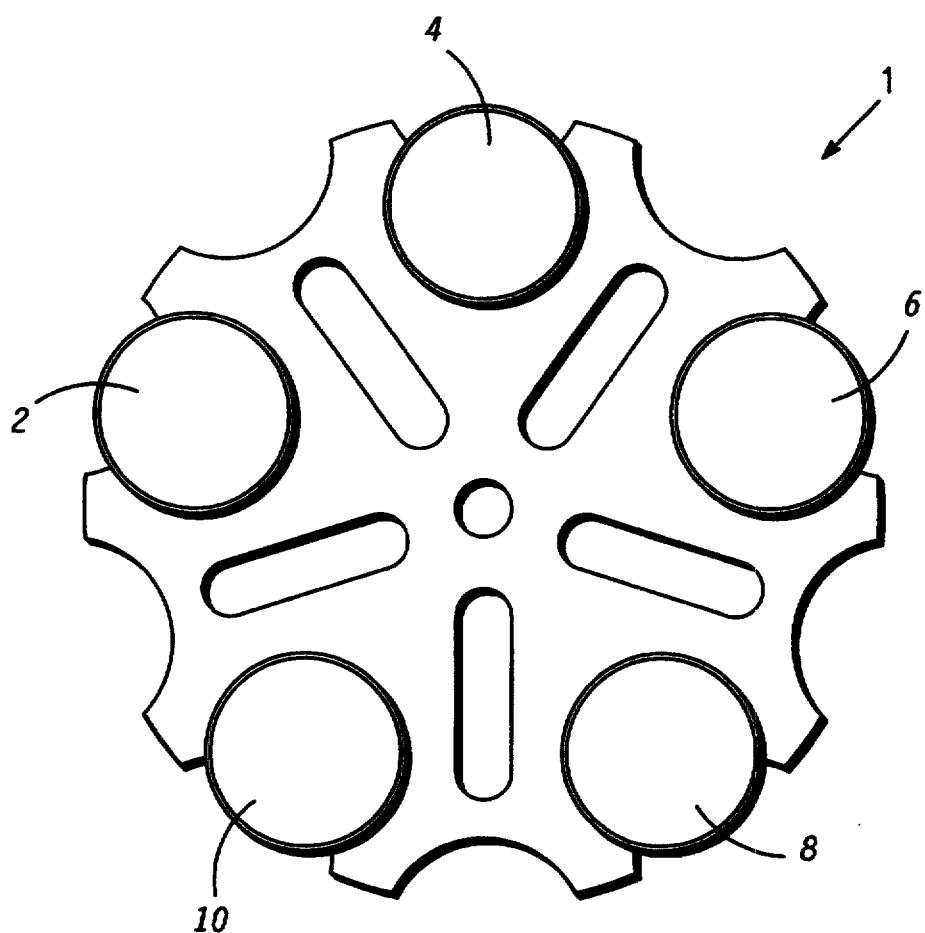
FIG. 1 is a top view of a sputtering system employing the preferred contacting member.
Figure 2:
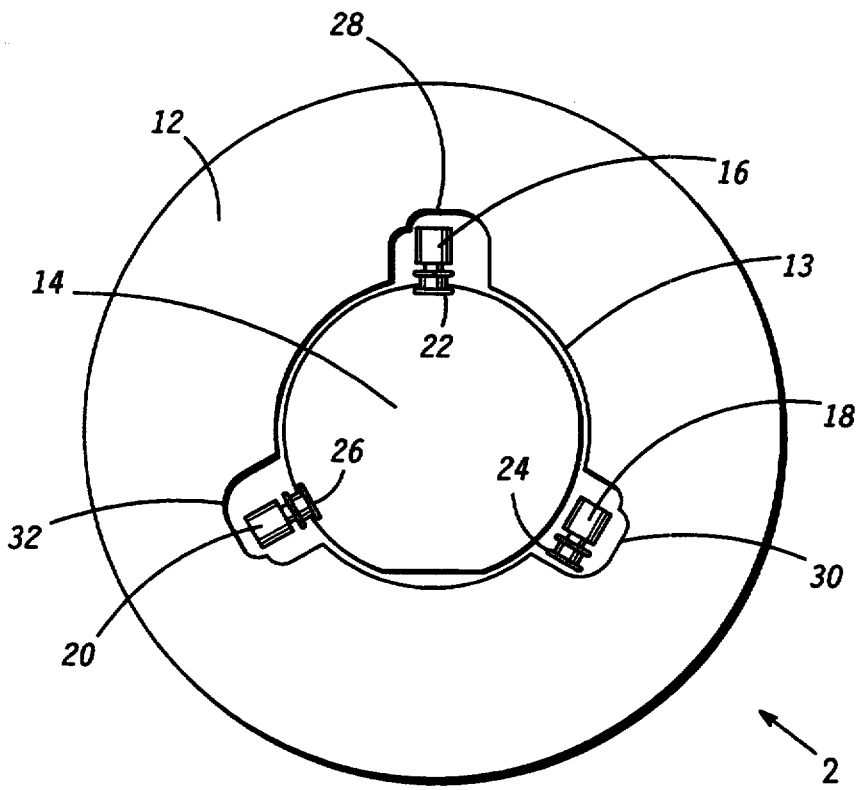
FIG. 2 is a top view of a wafer station of the sputtering system FIG. 1.
Figure 3:
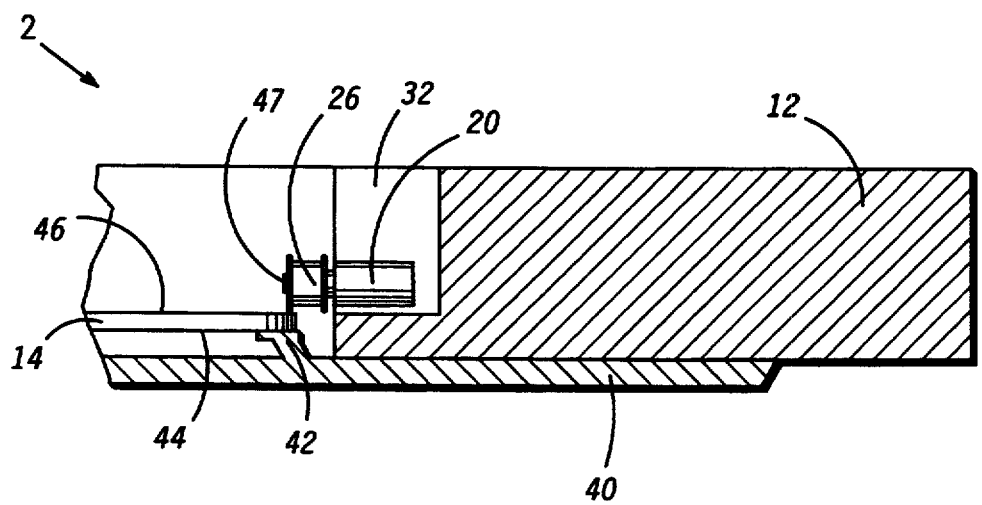
FIG. 3 is a cross-section partial side view of the wafer station of FIG. 2.

An example of a particular piece of processing equipment which may cause wafer breakage and therefore incur the associated disadvantages is the sputtering system shown in FIGS. 1-3.

FIG. 1 is a top view of the five station index plate 1 of a sputtering system. The index plate comprises wafer stations 2,4,6,8 and 10. Each of the stations receives a semiconductor wafer for processing. Each station may be associated with a different compartment of the sputtering system. For example, wafer station 2 may be a load lock wherein a wafer can be inserted into the system while vacuum to the rest of the system is maintained. Wafer station 4 may be an etch station wherein the wafer received by wafer station 2 may be etched. Wafer stations 6, 8 and 10 may each be different sputtering stations, wherein a different metal is sputtered on the wafer. The indexing plate 1 is capable of rotating a particular wafer through the various wafer station locations. Accordingly, a wafer initially inserted in the load lock station 2 may receive processing at each of the various process locations.

An exemplary wafer station 2 is shown in more detail in FIG. 2. Wafer station 2 comprises a wafer holding housing 12. Wafer holding housing 12 is generally annular shaped with opening 13 in the center for receiving wafer 14. Wafer station 2 additionally includes latch assemblies 16, 18 and 20. Extending from the latch assemblies 16, 18 and 20 are respective rollers 22, 24 and 26, which are rotatably mounted on shafts extending from the latch assemblies (not shown in FIG. 2, but see e.g. 47, FIG. 3). The individual latch assemblies and rollers are spaced circumferentially around opening 13 at approximately 120° from one another. The respective latch assemblies and rollers reside within cut-out portions 28, 30 and 32. Cut-out portions 28, 30 and 32 are shaped to allow their respective latch assemblies to swing 90° away from opening 13, into an "open" position. The latch assembly 18 with its roller 24 is shown in the open position.

When a wafer is loaded into wafer station 2 all of the latch assemblies and associated rollers are in the open position in a like manner to assembly 18 with roller 24. After the wafer 14 is placed in the central opening 13 of the wafer holder housing 12, the latch assemblies and associated rollers swing inward toward opening 13, to a "closed" position. Latch assembly 20 with its roller 26 is shown in the closed position.

In the closed position the rollers contact with the wafer in order to hold the wafer in place and brace it during processing. The wafer is not rotated during processing, and the rollers do not roll during processing. The rollers roll only when they are moved across the edge of the wafer from the open position to the closed position when a wafer is loaded, and from the closed position to the open position when a wafer is removed.

FIG. 3 is a cross-sectional partial side view of wafer station 2. FIG. 3 illustrates that wafer 14 is supported on the side opposite the rollers by a tab plate 40. Tab plate 40 comprises individual tabs including tab 42. There is a tab opposing each of the rollers 22, 24 and 26. Accordingly, wafer 14 is held in place during processing by being sandwiched between rollers and corresponding tabs. The side of the wafer 44 facing the tabs is the front side of the wafer. Frontside 44 is the side which is normally processed during device fabrication. The side 46 facing the rollers is considered the backside.

FIG. 3 also shows a side view of roller 26 mounted to latch assembly 20. Specifically, roller 26 is rotatably mounted on shaft 47. Shaft 47 extends perpendicularly from latch assembly 20. Latch assembly is shown housed in cut-out portion 32.

Figure 4:
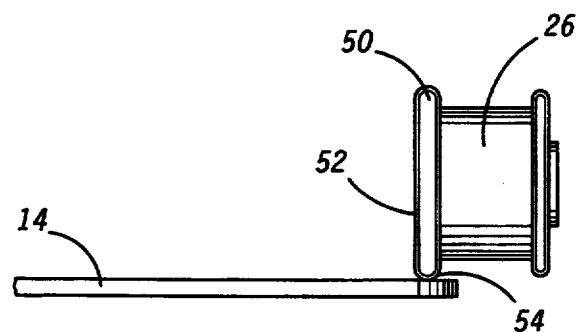
FIG. 4 is a side view of a prior art contacting member.

FIG. 4 is a side view showing, in more detail, roller 26, which is a prior art roller, positioned against wafer 14. The typical roller 26 of the prior art comprises a stainless steel roller having an annular shoulder 50 located at distal end 52 of roller 26. Annular shoulder 50 has a rounded contact surface Since contact surface 54 is rounded, it contacts the wafer 14 only at a single point.

The stainless steel roller 26 of the prior are tends to cause breakage for a variety of reasons. For example, since rounded surface 54 of annular shoulder 50 contacts the wafer at only a point, it concentrates heat and pressure at that single point. The concentrated pressure, of course, tends to cause breaking. Additionally, the concentrated heat causes localized thermal expansion which may lead to breaking.

Furthermore, the stainless steel roller of the prior art tends to expand under the high temperatures of certain modern processes. Roller 26 is rotatably mounted to shaft 47 (FIG. 3) with very close tolerances. When roller 26 expands, roller 26 tends to seize on the shaft and subsequently slide across wafer 14 when moved into place, rather than roll across. The sliding scores wafer 14 which leads to breakage. Furthermore, temperatures which are now being used to process semiconductor wafers are extreme enough to destroy a dacronite TM coating which is on the internal surface of the prior art roller 26. Additionally, the stainless steel material of the prior art roller 26 is relatively very hard. This hardness combined with the point contact caused by curved surface 54 results in scoring of the wafer, which leads to breaking.

The preferred novel and non-obvious contacting member in accordance with the present invention overcomes the substantial disadvantages of the prior art contacting member. The preferred contacting member according to the present invention is a ceramic roller adapted for use in the sputtering system illustrated by FIGS. 1-3.

An exemplary sputtering system suitable for employing the preferred contact member is the Materials Research Corporation's Eclipse TM. The function of the roller is described with reference to FIG. 2. As discussed above, wafer 14 is to be loaded into opening 13 of the wafer holder housing 12. During loading, the latch assemblies 16, 18, 20 and their associated rollers 22, 24, 26 are positioned away from opening 13 in an open position, as illustrated by latch 18 and roller 24. After wafer 14 is placed in opening 13, the latch assemblies with associated rollers swing inward to a closed position so that the rollers contact the wafer. The latch assembly and rollers remain stationary throughout the remainder of the processing. The wafer is not rotated and the rollers do not turn.

Wafer 14 is typically a III-V semiconductor material such as gallium arsenide. However, it will be recognized that the invention may be adapted for use with any semiconductor material in any environment, having any shape and size.

FIG. 3 illustrates that contacting member 26 is rotatably mounted to shaft 47 which extends from latch assembly 20. Ideally when latch assembly 20 swings into the closed position, contacting member 26 rolls across wafer 14, rather than sliding or dragging, thus avoiding scoring the wafer.

Figure 5:
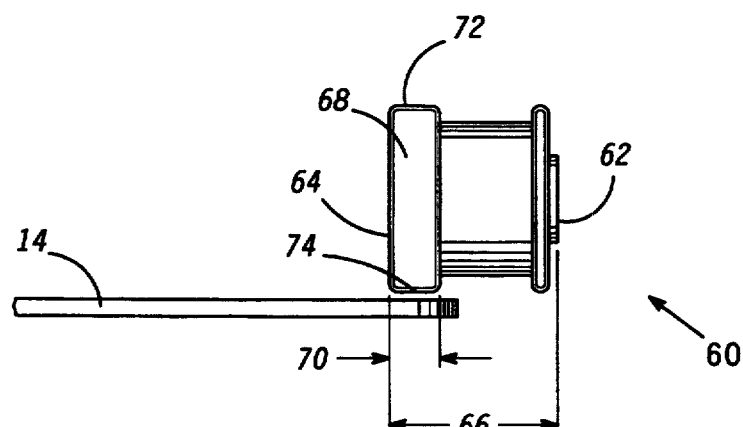
FIG. 5 is a side view of the preferred contacting member.

FIG. 5 is a side view of the preferred contact member in accordance with the present invention. The preferred contact member 60 is a roller formed substantially of ceramic. Ceramic roller 60 comprises a proximate end 62 and a distal end 64. The overall length of ceramic roller 60, as indicated by distance 66, approximately 0.798 cm (0.314 inches).

Ceramic roller 60 comprises a flange-like annular shoulder or collar 68 disposed at distal end 64. Annular shoulder 68 preferably extends less than half way back toward the proximate end 62. The annular shoulder 68 extends 0.18-0.19 cm back from distal end 64, and preferably 0.188 cm (0.074 inches) as indicated by distance 70.

Annular shoulder 68 comprises a flat outer surface 72. Flat outer surface or flat portion 72 is adapted to contact the semiconductor material 14. Flat outer surface 72 of annular shoulder 68 thus provides line contact along the surface 74, to the semiconductor material 14. This line contact of the ceramic roller in accordance with the present invention is compared to the point contact of the prior art roller. Specifically, referring to FIG. 4, rounded portion 54 of shoulder 50 of the prior art roller provides only point contact. As will be discussed in more detail below, the line contact at 74, provided by the roller accordance with the present invention, yields substantial advantage over the prior art with regard to minimizing breakage.

Ceramic roller 60 additionally preferably comprises substantially ceramic material which remains unaltered at temperatures above 500° C. One exemplary material which may be used is MACOR® from Duramatics Products TM, Inc. Relevant material specifications include; density of 2.52 g/cm$^3$, thermal expansion of 110E10$^{-7}$/° C. to 600° C., thermal conductivity of 0.004 cal cm/sec cm$^2$ ° C. maximum use temperature of 1000° C., Knoop hardness of 250, and coefficient of kinetic friction of 0.12 against steel.

Figure 6:
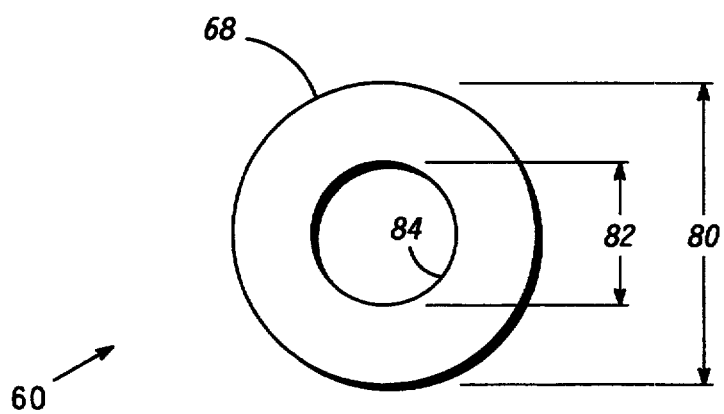
FIG. 6 is an end view of the preferred contacting member.

FIG. 6 is an end view of ceramic roller 60. Ceramic roller 60 has an outside diameter of less than 1.03 cm (0.404 inches), and preferably 1.0 cm (0.395 inches), as indicated by distance 80. Furthermore, roller 60 has an inside diameter of greater than 0.39 cm (0.154 inches), and preferably 0.40 cm (0.156 inches) as indicated by distance 82. The inside diameter of roller 60 is defined by an annular interior wall 84. The outside diameter of the roller 60 is defined by annular shoulder 68. The relatively small outside diameter reduces the pressure against the wafer. The relatively large inside diameter reduces friction between roller and shaft, thereby insuring that the roller will roll rather than slide or drag.

Ceramic roller 60 in accordance with the present invention provides substantial advantage over the prior art. The ceramic material used, preferably MACOR®, provides substantial advantage over the stainless steel material of the prior art roller, such as roller 26 in FIG. 4. The preferred ceramic material is much softer than stainless steel, and consequently will not readily score semiconductor wafers. Additionally, the ceramic does not retain heat as well as stainless steel, and therefore will subject the semiconductor wafer to much less thermal trauma. Furthermore, the ceramic is easily machined. The machinability combined with the fact that ceramic is typically much less expensive than stainless steel results in a substantial cost savings over the prior art.

Moreover, the flat exterior surface 72 of annular shoulder 68 provides substantial advantage over the prior art. As explained above, the conventional roller depicted in FIG. 4 has a round contacting surface 54 which provides point contact to the wafer. It was originally thought that point contact was preferable in order to minimize the amount of contact between wafer and roller. It is now understood, however, that an enlarged contact surface is preferable because it significantly decreases breakage.

In the preferred embodiment, the flat exterior surface 72 provides line contact, rather than point contact, to semiconductor wafer 14. Consequently, pressure and heat are distributed throughout the contacting surface 74, rather than being concentrated at a single point, as in the prior art. Furthermore, the greater area of contact insures that the roller will roll across the wafer surface, and not slide, stick or drag.

Additionally, the outside diameter of roller 60 is smaller than the outside diameter of the roller of the prior art (not shown). Specifically, the outside diameter of roller 60 is preferably 1.0 cm (0.395 inches), while the outside diameter of the prior art roller is 1.03 cm (0.406 inches). The decrease in the dimension of outside diameter results in a decrease in pressure against the semiconductor wafer.

Furthermore, the inside diameter of the preferred roller 60 is larger than the inside diameter of the prior art roller (not shown). Specifically, the inside diameter of the preferred roller 60 is 0.40 cm (0.156 inches), while the inside diameter of the prior art roller is 0.39 cm (0.152 inches). The larger inside diameter provides easier rolling around shaft 47 attached to latch assembly 20 (FIG. 3). Consequently, roller 60 does not seize on the shaft. Therefore, roller 60 rolls along the surface of the semiconductor 14, substantially free from sliding across the wafer which could cause scoring and breaking.

By now it should be appreciated that an improved, novel and non-obvious semiconductor material contacting member is provided. The preferred contacting member in accordance with the present invention is a ceramic roller used in a semiconductor sputtering system. The preferred contacting member provides substantial advantages over the prior art which greatly reduces the potential for semiconductor material breakage and associated difficulties.

We claim:

1. A method for contacting semiconductor material, comprising the steps of:
   providing a ceramic cylinder comprising an annular flat portion comprising a contact surface; and
   contacting the semiconductor material with the contact surface, thereby distributing pressure to the semiconductor material throughout the contact surface.

2. The method of claim 1, further comprising the steps of rotatably mounting the ceramic cylinder to a shaft, and rolling the ceramic cylinder across the semiconductor material substantially free from sliding.

3. The method of claim 1, further comprising providing a III-V wafer as the semiconductor material.

4. The method of claim 1, further comprising the step of heating the semiconductor material to above 500° C.

5. The method of claim 1, wherein the step of providing the ceramic cylinder comprises providing the annular flat portion so as to extend less than half the length of the ceramic cylinder.

* * * * *